United States Patent [19]
Chen

[11] Patent Number: 6,104,609
[45] Date of Patent: Aug. 15, 2000

[54] STRUCTURE COMPUTER CENTRAL PROCESSING UNIT HEAT DISSIPATER

[76] Inventor: A-Chiang Chen, 18F-2, No. 2, Lane 175, Sec. 3, Shiou-Lang Road, Chung-Ho City, Taipei Hsien 235, Taiwan

[21] Appl. No.: 09/289,741

[22] Filed: Apr. 12, 1999

[30] Foreign Application Priority Data

Feb. 3, 1999 [TW] Taiwan ................................. 88203139

[51] Int. Cl.$^7$ ....................................................... H05K 7/20
[52] U.S. Cl. .......................... 361/695; 361/690; 361/694; 361/704; 257/718; 257/719; 257/721; 257/722; 174/16.1; 174/16.3; 165/80.3
[58] Field of Search ..................... 361/688–690, 361/694, 695, 697, 703, 704, 707, 709, 710; 165/80.3, 185; 174/16.3; 257/706, 707, 712, 713, 717, 719, 721, 722

[56] References Cited

U.S. PATENT DOCUMENTS

| | | | |
|---|---|---|---|
| 3,480,837 | 11/1969 | Feldmann | 361/707 |
| 3,536,960 | 10/1970 | Otteson et al. | 361/707 |
| 5,038,858 | 8/1991 | Jordan et al. | 165/185 |
| 5,558,155 | 9/1996 | Ito | 165/80.3 |
| 5,828,551 | 10/1998 | Hoshino et al. | 361/697 |
| 5,864,464 | 1/1999 | Lin | 361/697 |
| 5,940,269 | 8/1999 | Ko et al. | 361/697 |
| 5,943,210 | 8/1999 | Lee et al. | 361/697 |

*Primary Examiner*—Leo P. Pacard
*Assistant Examiner*—Boris Chervinsky
*Attorney, Agent, or Firm*—Dougherty & Troxell

[57] ABSTRACT

An improved structure computer central processing unit heat dissipater, more specifically a computer central processing unit heat dissipation structure having modular heat sink element capability. The present invention is comprised of a fan, an upper cover, a heat sink assembly, and a lower cover, wherein the heat sink assembly is composed of numerous metal heat sink elements that are interlock-assembled together front to back in a flush arrangement. The thickness of the heat sink elements are thinner than that of conventional structures, while each element has a hook and a slot for purposes of assembly. Furthermore, an intervallic channel for the air flow heat dissipation area is formed between the conjoined hooks and slots. There is a concave-sectioned surface at the center section to reduce air resistance and interference as well as heat conduction fins along the bottom sections to enhance the contact area with the heat source at the lower cover to thereby increase heat conduction efficiency. As such, the improved structure of the invention herein increases fan performance and accelerates the rate of heat dissipation, allowing the central processing unit to function under optimal operating temperature conditions for the duration of operation and, furthermore, offers additional computer utilization stability.

2 Claims, 6 Drawing Sheets

STRUCTURE COMPUTER CENTRAL PROCESSING UNIT HEAT DISSIPATER

BACKGROUND OF THE INVENTION

1) Field of the Invention

The invention herein relates to an improved structure computer central processing unit heat dissipater, more specifically a heat dissipation structure interlock-assembled from modular heat sink elements having concave-sectioned surfaces, hooks, slots, and heat conduction fins that increases the area of heat dissipation and the rate of heat conduction and augments the low temperature heat dissipation capability of central processing units, which is advantageous to computer stability.

2) Description of the Prior Art

Central processing units (CPU) are the most crucial components of computers and are the indispensable cores of computers. Due to the continuous development of computer technology and the enhancement of integrated circuit production technology, CPU execution speeds are always increasing, with the amount of heat generated rising in direct proportion. If the rate of CPU heat dissipation is insufficient, computer operating stability will be affected. As a result, the most direct and easy solution to the CPU overheating problem is to install a heat dissipation device on the CPU so the high temperature produced by the CPU is drawn away from the heat source and diffused by a heat dissipation device, thereby maintaining the execution stability of the CPU. As is widely known, conventional heat dissipation devices currently available, as indicated in FIG. 1, are comprised of a fan and a heat sink, wherein the fan 11 is fastened with screws 111 to the upper cover 12 of the heat sink 10 and the heat sink 10 secured by means of mounting pins 15 inserted in the mounting holes 21 of the mainboard 20, with spring clips 30 attached to the mounting pins 15 keeping the base plate 14 of the heat sink 14 in firm contact under pressure against the CPU 22; due to the air inducted by the fan 11, the high temperature produced by the CPU 22 during operation is conveyed through the heat sink fin area 13 of the heat sink 10 to diffuse the heat source and thereby achieve heat dissipation; however, the heat sink structure of most conventional heat dissipation devices that are constructed of a single piece of extruded aluminum with heat sink fins and base plates additionally machined (referring to FIG. 2) are subject to the limitations of mold removal and extrusion technology in that the separated surfaces 161 are thicker, which not only results in a larger area of fan air flow isolation, but also a slower rate of heat conduction and, furthermore, since the heat sink fin distance 162 is overly large, the number of heat sink fins is less, and the overall heat dissipation area is small, there is a negative effect on the rate of heat dissipation by the heat sink. Furthermore, the aluminum extrusion finishing process is procedurally complicated and not only is fabrication speed slow, additional cutting and shaving is required involving considerable material consumption losses and proportionately higher production costs. Also available on the current market is a type of aluminum-finned heat sink structure which, as indicated in FIG. 3, is shaped by a milling process, and then the heat sink fins 17 are either fastened or glued to the base plate 18; however, during assembly, a separation zone 19 is required between the rows of heat sink fins, which reduces the heat dissipation area and, furthermore, since its fabrication and assembly are difficult, quality control is problematic. In this type of heat sink, the air flow separation surfaces are larger, while the distance between the horizontal surfaces and the fan are extremely close, which impedes fan air flow and decreases fan efficiency and, furthermore, the heat sink shortcomings due to the aluminum extrusion finishing process remain unimproved.

In view of the various shortcomings of conventional heat dissipation devices in terms of heat sink design structure, and the many resulting negative aspects affecting utilization and stability, the inventor of the invention herein, based on experience gained from engagement in electronics hardware manufacturing and technology, addressed the said shortcomings by researching solutions for them which, following continuous research and improvements, culminated in the development of the improved structure computer central processing unit heat dissipater of the invention herein, a structure capable of eliminating the numerous drawbacks of the conventional technology.

SUMMARY OF THE INVENTION

Specifically, the improved structure computer central processing unit heat dissipater of the invention herein consists of a heat sink wherein the primary elements are punch press fabricated and the heat sink elements and the air flow separation areas are thinner (by five times approximately) than would be possible by aluminum extrusion and milling processes and, furthermore, the design involves the utilization of hooks and slots, wherein a hook and a slot are formed at the highest and lowest extent of the heat sink elements to facilitate rapid assembly, utilizing automated production to assemble one or more heat sink elements and, furthermore, the hooks determine the leaving of a certain interval and distance, which not only allows for a larger number of heat sink elements compared to conventional structures, but provides for superior heat dissipation efficiency; furthermore, the separation area of the heat seat elements includes a concave-sectioned surface that enables a smaller degree of fan air flow isolation and reduces the reverse flow produced by air resistance to achieve maximum fan performance. Furthermore, the design of the invention herein includes a long heat conduction fin along the bottom end of the heat sink element that greatly enhances the contact area with the heat source at the lower cover and enables the heat sink elements achieve optimal heat conduction and heat dissipation efficiency.

Therefore, the primary objective of the invention herein is to provide an improved structure computer central processing unit heat dissipater, wherein the heat sink assembly is composed of numerous metal heat sink elements that are interlock-assembled together front to back in a flush arrangement; the thickness of the heat sink elements are thinner than that of conventional structures, while each element has a hook and a slot and, furthermore, an intervallic air flow heat dissipation area is formed between the conjoined hooks and slots; and since the heat sink elements are thinner than that of the conventional structures, the invention herein has a larger number of heat sink elements than conventional products, enabling a larger area of heat dissipation and a greater rate of heat dissipation.

Another objective of the invention herein is to provide an improved structure computer central processing unit heat dissipater, wherein a concave-sectioned surface is formed along the center section of the heat sink elements at the fan air flow entry opening to reduce flow resistance and interference during air induction by the fan to achieve maximum fan efficiency and effectively accelerate the rate of heat dissipation.

Yet another objective of the invention herein is to provide an improved structure computer central processing unit heat dissipater, wherein there are heat conduction fins along the bottom sections of the heat sink elements that greatly increases the contact area with the heat source at the lower cover and enables the heat sink elements to achieve optimal heat conduction and heat dissipation efficiency.

To enable a further understanding of the said objectives, the technological methods, and specific structural innovations of the invention herein, the brief description of the drawings below is followed by detailed description of the preferred embodiments.

DETAILED DESCRIPTION OF PREFERRED EMBODIMENTS

Figure 1:
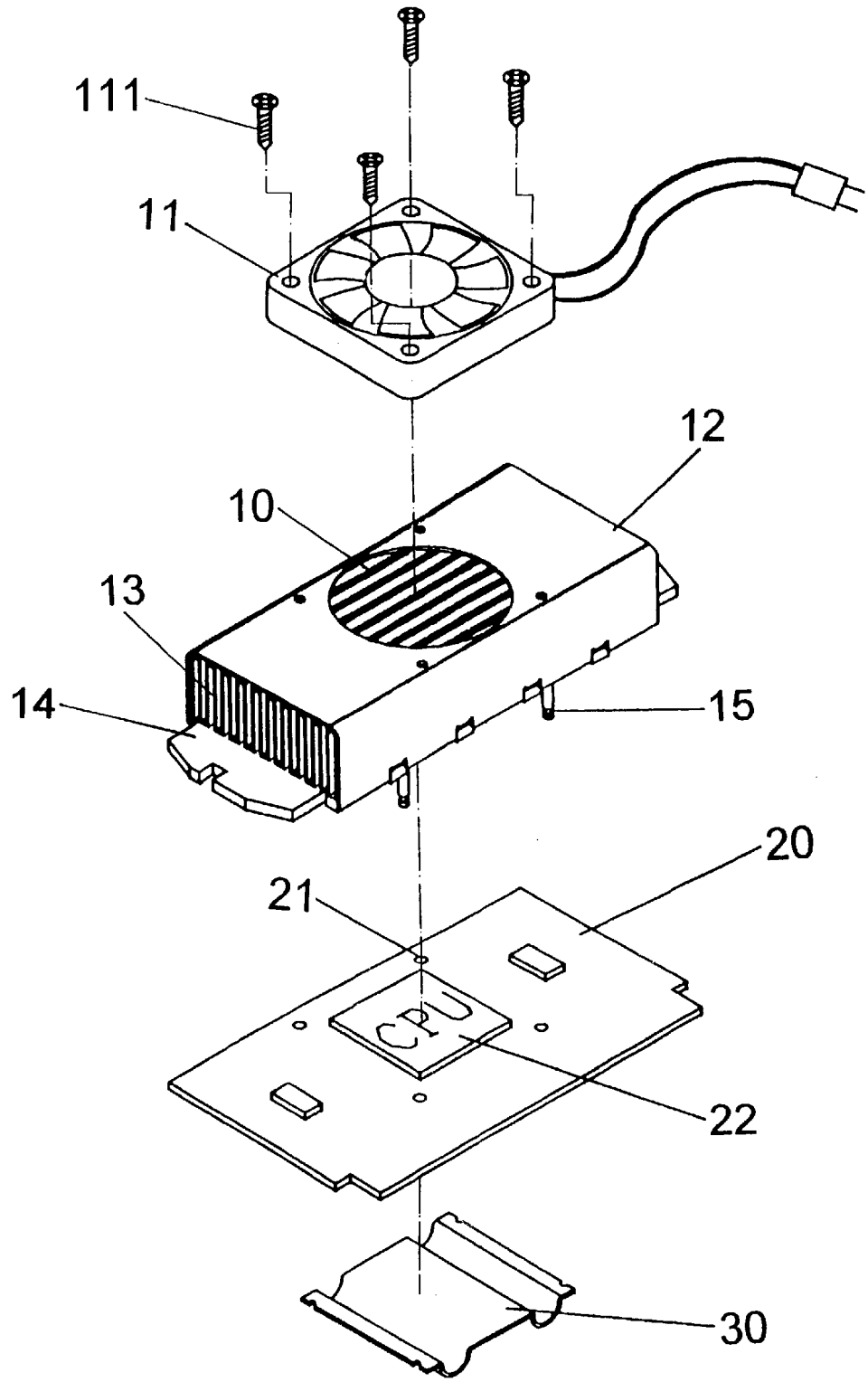
FIG. 1 is an exploded perspective view of a conventional heat dissipation device.
Figure 2:
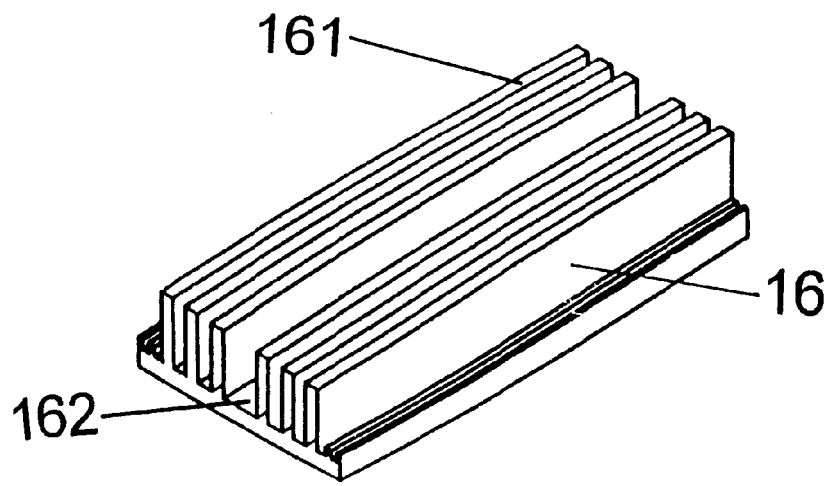
FIG. 2 is a perspective view of a conventional heat sink.
Figure 3:
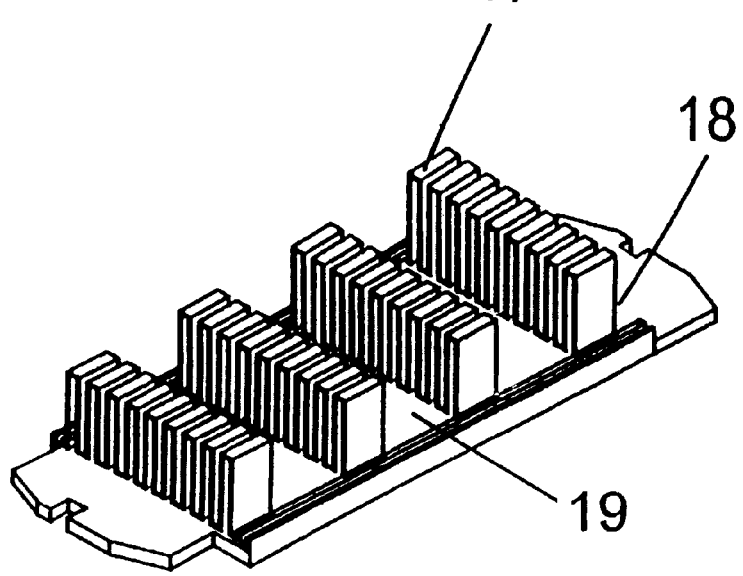
FIG. 3 is a perspective view of another conventional heat sink.
Figure 4:
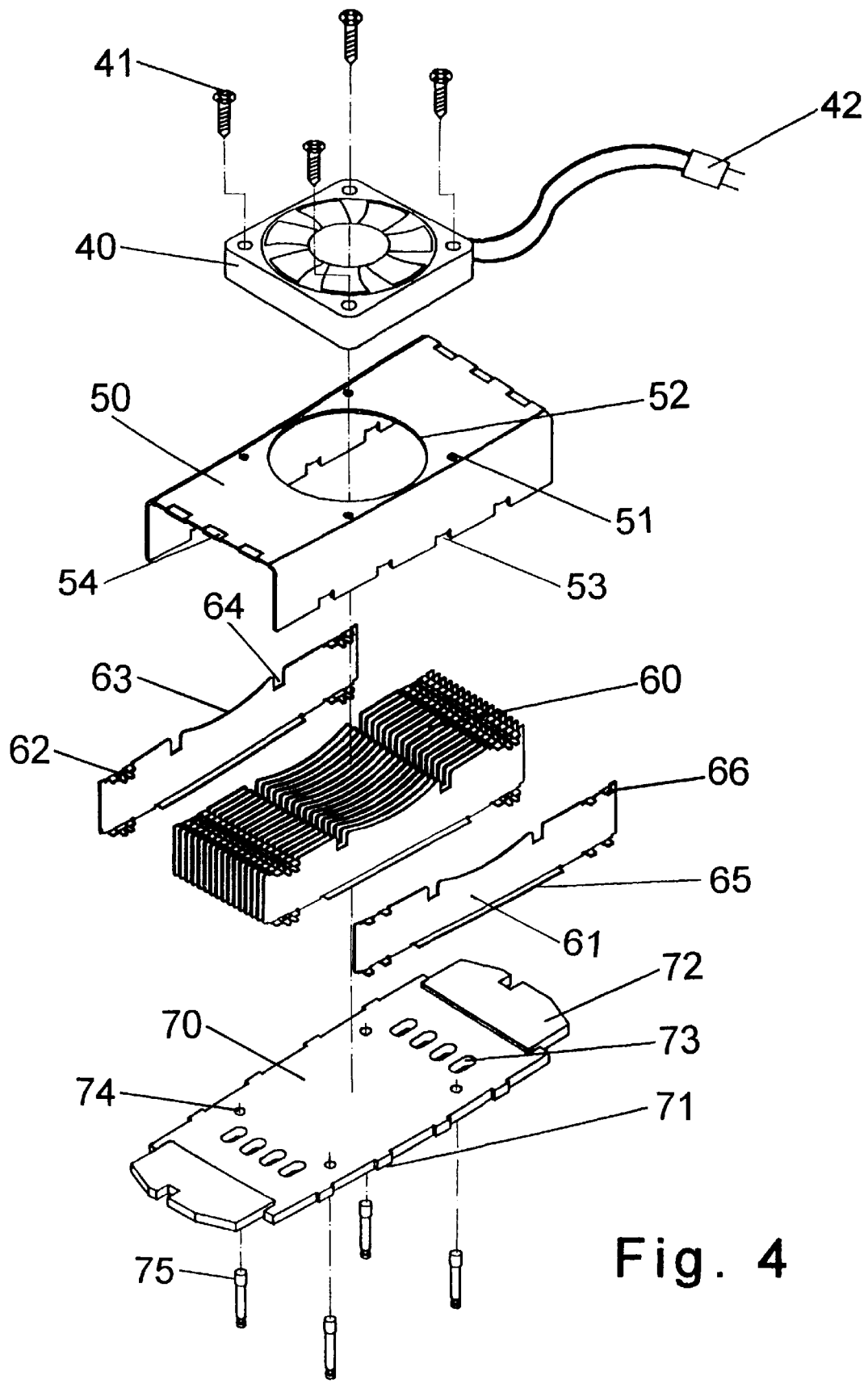
FIG. 4 is an exploded perspective view of the invention herein.
Figure 5:
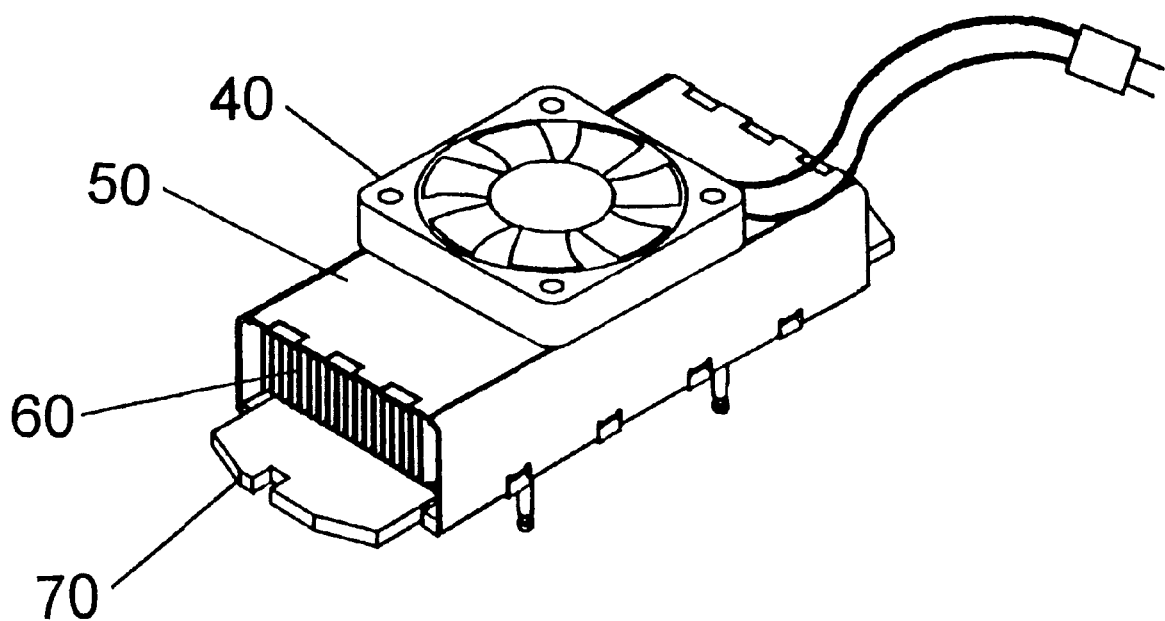
FIG. 5 is an isometric drawing of the invention herein.
Figure 6A:
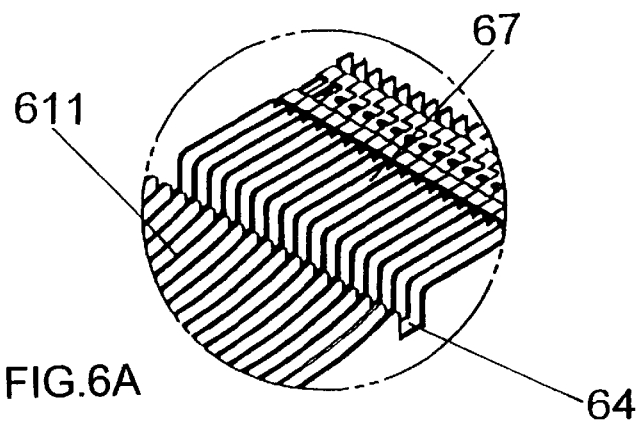
FIG. 6A is an enlarged view of area A in FIG. 6.
Figures 6, 6B:
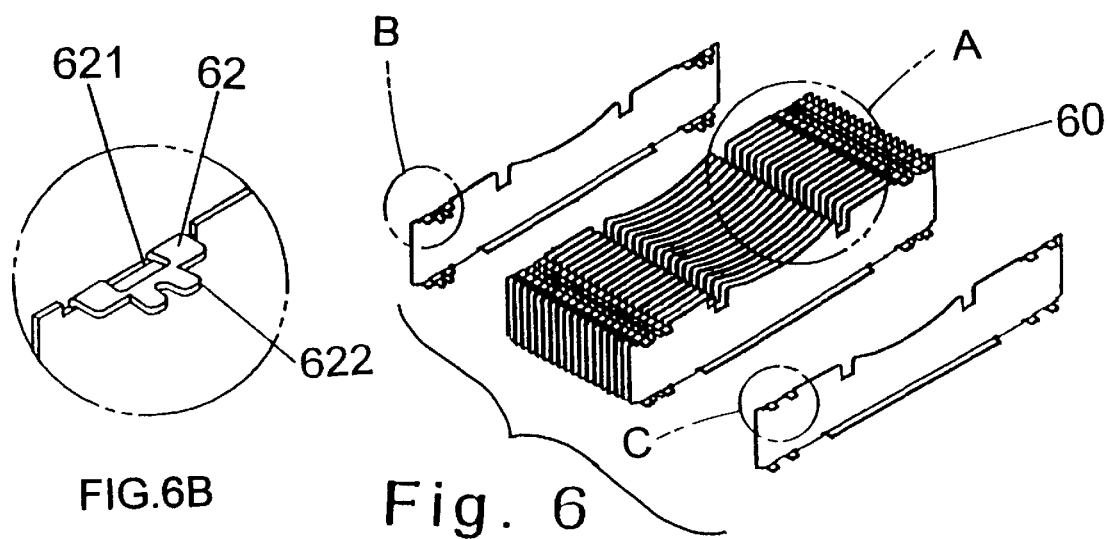
FIG. 6 is an exploded perspective view of the heat sink of the invention herein.
FIG. 6B is an enlarged view of area B in FIG. 6.
Figure 6C:
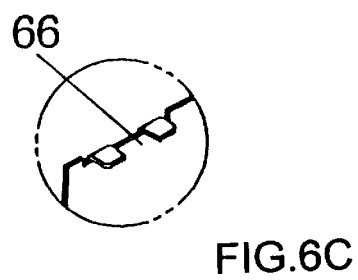
FIG. 6C is an enlarged view of area C in FIG. 6A.

Referring to FIG. 4, the improved structure computer central processing unit heat dissipater of the invention herein appears similar in terms of component arrangement to conventional devices and is comprised of a fan 40, an upper cover 50, a heat sink assembly 60, and a lower cover 70; when assembled, the heat sink assembly 60 is secured to the lower cover 70, with the left and right extent of the heat sink assembly 60 held in place by the mounting plates 72 protruding from the two ends of the lower cover 70 and the front and rear of the heat sink assembly 60 held in place by the guide slots 54 of the upper cover 50 and, at the same time, the fastening slots 53 of the upper cover 50 are enslotted over the fastening tabs 71 of the lower cover 70, enabling the upper cover 50 and the lower cover 70 to remain firmly assembled, and then the fan 40 is screw fastened to the screw holes 51 of the upper cover 50; and the mounting pins 75 are inserted into the mounting holes 74 of the lower cover 70, resulting in the completed structure shown in FIG. 5.

Referring to FIGS. 6, 6A, 6B and 6C, the innovation of the invention herein is that the said heat sink assembly 60 consists of modular heat sink elements 61 mutually interlocked at the front and the rear in a flush arrangement, and there are one or more interlocking sections 62 disposed in the same direction along the horizontal sections along the top ends and the bottom ends of each heat sink element 61, and each heat sink element 61 has in an identical orientation along the top a hook 622 at the front with a male-female interlocking slot 621 at the rear and, furthermore, the intervallic channels produced when the front hook 622 and the rear locking slot 621 are interlock-assembled together forms an air flow heat dissipation area 67, wherein since the heat sink element 61 is thinner than the conventional structure, a larger number of heat sink elements 61 can be utilized than in conventional arrangements, resulting in a greater area of heat dissipation.

Figure 7:
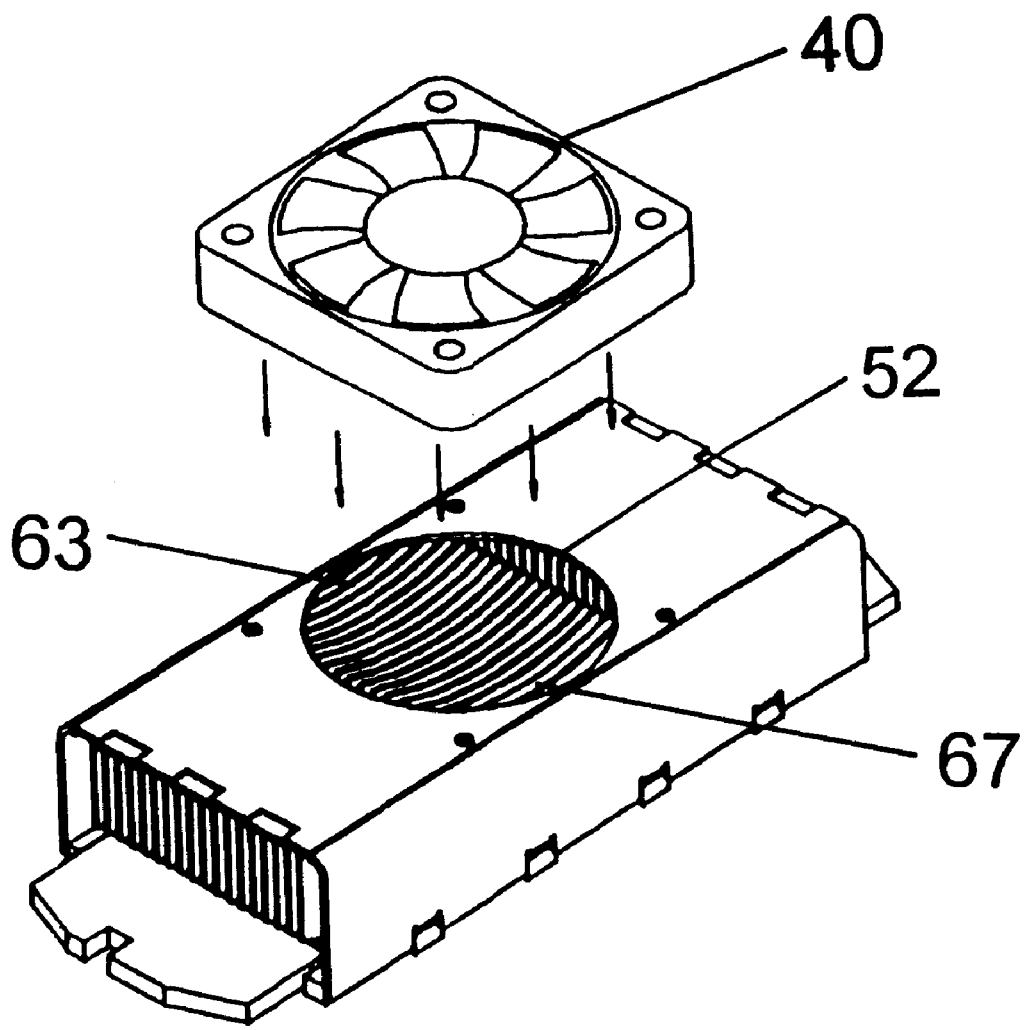
FIG. 7 is a perspective view of the air flow structure of the invention herein.

Referring to FIG. 7, a concave-sectioned surface 63 is formed along the center section of the heat sink elements 61 at the fan air flow entry opening 52 to reduce flow resistance and interference during air induction by the fan 40 to achieve maximum fan efficiency; furthermore, since the heat dissipation element air resistance surfaces 611 are thinner, not only is air resistance and interference minimized, but the rate of heat dissipation is effectively accelerated.

Furthermore, a long heat conduction fin 65 protrudes from the horizontal surface along the bottom end of each heat sink element 61 and, after the heat sink elements 61 are assembled into a heat sink assembly 60, the bottom section of the heat sink assembly 60 becomes a physically contiguous heat conductance contact surface due to the conjoinment of the heat conduction fins 65, significantly increasing the contact area with the heat source at the lower cover 70 and thereby enabling the heat sink elements 61 to achieve optimal heat conductance and heat dissipation efficiency.

Furthermore, when the final heat sink element 61 ( the nineteenth element approximately) of the invention herein is assembled, that heat sink element 61 only needs to have a interlocking slot structure 66 to prevent the wastage of space in the heat dissipation area.

Another aspect worthy of mention is that the recessed sections 64 situated at the top end of the heat sink elements 61 of the invention herein can accommodate the passage of the fastening screws 41 through the fan 40 and into the screw holes 51 without crushing and deforming the heat sink elements 61.

However, the terminology utilized for the said drawings and components have been selected to facilitate the description of the invention herein and shall not be construed as a limitation on the patented scope and claims of the invention herein and, furthermore, all substitutions of equivalent components by persons skilled in the relevant technology based on the spirit of the invention herein shall still be regarded as within the protected scope and claims of the new patent rights granted the invention herein.

In summation of the foregoing section, the improved structure computer central processing unit heat dissipater of the invention herein is an invention of reasonable perfection that not only possesses outstanding practicality, but has an unprecedented structural spatial design that is original and innovative and, furthermore, the punch press technology fabricated modular heat sink elements have a larger area of heat conductance and a greater rate of heat dissipation that is manifestly capable of increased computer central processing unit heat dissipation performance, is a solution to the height characteristics of inventions based on the conventional technology and, furthermore, is progressive and not a conception based merely on familiarity of utilization; therefore, the invention herein fully complies will all new patent application requirements and is hereby submitted to the patent bureau for review and the granting of the commensurate patent rights.

What is claimed is:

1. A computer central processing unit heat dissipater comprising:
   a) a lower cover having thereon a plurality of fastening tabs and two mounting plates located on opposite ends;
   b) a plurality of identical, spaced apart first heat sink elements fabricated by a punch press and located on the lower cover between the mounting plates, each first heat sink element having: an upper edge facing away from the lower cover with a concavely curved portion; a hook extending laterally from one side; and a female interlocking slot located such that the interlocking slot of each first heat sink element interlocks with the hook of an adjacent first heat sink element;

c) at least one second heat sink element located on the lower cover adjacent to and spaced from one of the plurality of first heat sink elements, the at least one second heat sink element having an upper edge facing away from the lower cover with a concavely curved portion and an interlocking slot engaged by the hook of the adjacent first heat sink element;

d) an upper cover having an inverted U-shaped cross-sectional configuration, the upper cover having a plurality of fastening slots engaged with the plurality of fastening tabs and an air flow opening located in alignment with the concavely curved portions of the first and second heat sink elements;

e) a fan mounted on the upper cover in alignment with the air flow opening by a plurality of fastening elements extending through fastening holes in the upper cover; and, f) a plurality of recessed sections formed in the upper edge of the first and second heat sink elements, the recessed sections of each heat sink element being aligned with the recessed sections of adjacent heat sink elements and located such that fastening elements extending through the upper cover extend into the recessed portions without deforming the first and second heat sink elements.

2. The heat dissipater of claim 1 wherein each first and second heat sink element has a lower edge and further comprises a heat conduction fin extending laterally from each of the lower edges to form a physically contiguous heat conductance contact surface in contact with the lower cover.

* * * * *